(12) United States Patent
Carson et al.

(10) Patent No.: US 11,482,835 B2
(45) Date of Patent: Oct. 25, 2022

(54) VCSEL DEVICE WITH MULTIPLE STACKED ACTIVE REGIONS

(71) Applicant: Lumentum Operations LLC, San Jose, CA (US)

(72) Inventors: Richard F. Carson, Albuquerque, NM (US); Nein-Yi Li, Albuquerque, NM (US); Mial E. Warren, Albuquerque, NM (US); Thomas Fanning, Albuquerque, NM (US); Gianluca Bacchin, Albuquerque, NM (US)

(73) Assignee: Lumentum Operations LLC, San Jose, CA (US)

( * ) Notice: Subject to any disclaimer, the term of this patent is extended or adjusted under 35 U.S.C. 154(b) by 297 days.

(21) Appl. No.: 16/917,785

(22) Filed: Jun. 30, 2020

(65) Prior Publication Data

US 2020/0335942 A1    Oct. 22, 2020

Related U.S. Application Data

(63) Continuation-in-part of application No. 16/733,901, filed on Jan. 3, 2020, now Pat. No. 10,756,515, which
(Continued)

(51) Int. Cl.
*H01S 5/042*    (2006.01)
*H01S 5/183*    (2006.01)
(Continued)

(52) U.S. Cl.
CPC ........ *H01S 5/04256* (2019.08); *H01S 5/0014* (2013.01); *H01S 5/0234* (2021.01);
(Continued)

(58) Field of Classification Search
CPC ................................................. H01S 5/04256
(Continued)

(56) References Cited

U.S. PATENT DOCUMENTS 7,949,024 B2    5/2011    Joseph
9,746,369 B2    8/2017    Shpunt et al.
(Continued)

FOREIGN PATENT DOCUMENTS

DE    102012209270 A1    12/2013
DE    112014003371 T5    4/2016
(Continued)

OTHER PUBLICATIONS

Extended European Search Report for Application No. EP18839037.1, dated Mar. 24, 2021, 7 pages.
(Continued)

*Primary Examiner* — Tuan N Nguyen
(74) *Attorney, Agent, or Firm* — Harrity & Harrity, LLP

(57) ABSTRACT

Methods, devices and systems are described for enabling a series-connected, single chip vertical-cavity surface-emitting laser (VCSEL) array. In one aspect, the single chip includes one or more non-conductive regions one the conductive layer to produce a plurality of electrically separate conductive regions. Each electrically separate region may have a plurality of VCSEL elements, including an anode region and a cathode region connected in series. The chip is connected to a sub-mount with a metallization pattern, which connects each electrically separate region on the conductive layer in series. In one aspect, the metallization pattern connects the anode region of a first electrically separate region to the cathode region of a second electrically separate region. The metallization pattern may also comprise cuts that maintain electrical separation between the anode and cathode regions on each conductive layer region, and that align with the etched regions.

20 Claims, 12 Drawing Sheets

Related U.S. Application Data is a continuation of application No. 16/045,633, filed on Jul. 25, 2018, now Pat. No. 10,530,128.

(60) Provisional application No. 62/536,918, filed on Jul. 25, 2017.

(51) Int. Cl.
| | | |
|---|---|---|
| *H01S 5/42* | (2006.01) | |
| *H01S 5/00* | (2006.01) | |
| *H01S 5/0234* | (2021.01) | |
| *H01S 5/0237* | (2021.01) | |
| *H01S 5/02345* | (2021.01) | |
| *H01S 5/024* | (2006.01) | |
| *H01S 5/40* | (2006.01) | |
| *H01S 5/02* | (2006.01) | |
| *H01S 5/062* | (2006.01) | |

(52) U.S. Cl.
CPC ........ *H01S 5/0237* (2021.01); *H01S 5/02345* (2021.01); *H01S 5/0425* (2013.01); *H01S 5/04257* (2019.08); *H01S 5/06226* (2013.01); *H01S 5/18311* (2013.01); *H01S 5/18347* (2013.01); *H01S 5/423* (2013.01); *H01S 5/0208* (2013.01); *H01S 5/02469* (2013.01); *H01S 5/04252* (2019.08); *H01S 5/04254* (2019.08); *H01S 5/18375* (2013.01); *H01S 5/18377* (2013.01); *H01S 5/4018* (2013.01); *H01S 2301/176* (2013.01)

(58) Field of Classification Search
USPC ..................................................... 372/35, 36
See application file for complete search history.

(56) References Cited

U.S. PATENT DOCUMENTS

| | | | |
|---|---|---|---|
| 10,530,128 | B2 | 1/2020 | Carson et al. |
| 10,756,515 | B2 | 8/2020 | Carson et al. |
| 2009/0267085 | A1 | 10/2009 | Lee et al. |
| 2013/0163626 | A1* | 6/2013 | Seurin .................... F21V 29/70 372/36 |
| 2015/0110140 | A1 | 4/2015 | Letsch et al. |
| 2015/0340841 | A1 | 11/2015 | Joseph |
| 2016/0141839 | A1 | 5/2016 | Matsubara et al. |
| 2016/0240999 | A1 | 8/2016 | Barbarossa et al. |

FOREIGN PATENT DOCUMENTS

| | | |
|---|---|---|
| JP | 2006147874 A | 6/2006 |
| JP | 2014093463 A | 5/2014 |
| JP | 2015510279 A | 4/2015 |
| JP | 2016519436 A | 6/2016 |
| WO | 2013136205 A2 | 9/2013 |
| WO | 2014175901 A1 | 10/2014 |
| WO | 2016191717 A1 | 12/2016 |

OTHER PUBLICATIONS

Rosprim et al.; "Progress in optimization of high-power high-speed VCSEL arrays"; Proceedings of SPIE; vol. 10122; Feb. 2017; pp. 1-11 (Year: 2017).

Rosprim et al.; "Progress in optimization of high-power high-speed VCSEL arrays"; Proceedings of SPIE; vol. 10122; Feb. 2017; 11 pages.

International Patent Application No. PCT/US2018/043786; Int'l Search Report and the Written Opinion; dated Oct. 4, 2018; 10 pages.

Carson et al.; "Progress in high-power high-speed VCSEL arrays"; SPIE vol. 9766—Vertical-Cavity Surface-Emitting Lasers XX; Mar. 2016; 15 pages.

International Patent Application No. PCT/US2018/043786; Int'l Preliminary Report on Patentability; dated Feb. 6, 2020; 9 pages.

* cited by examiner

FIG. 6 (Bottom side of chip)

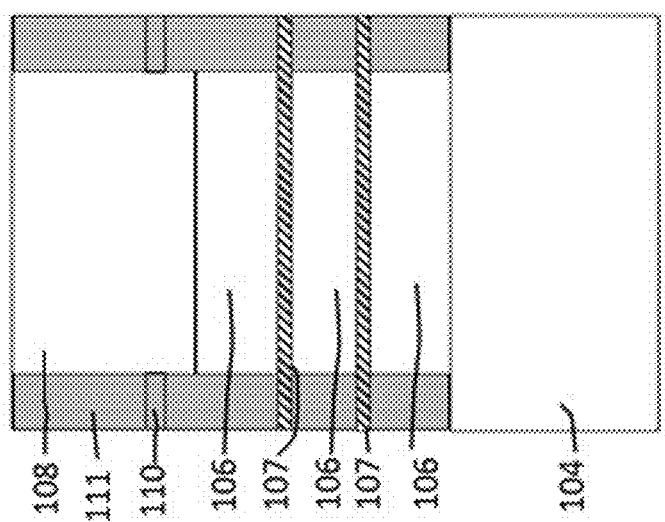
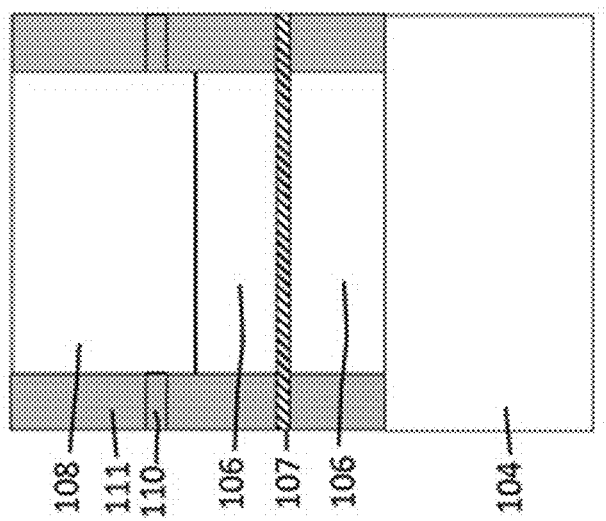
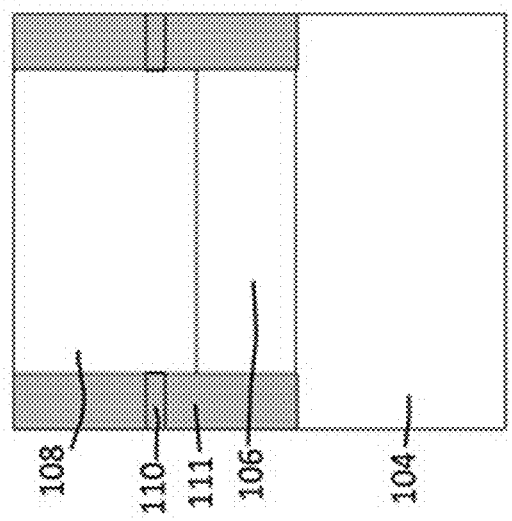
FIG. 11(a)
FIG. 11(b)
FIG. 11(c)

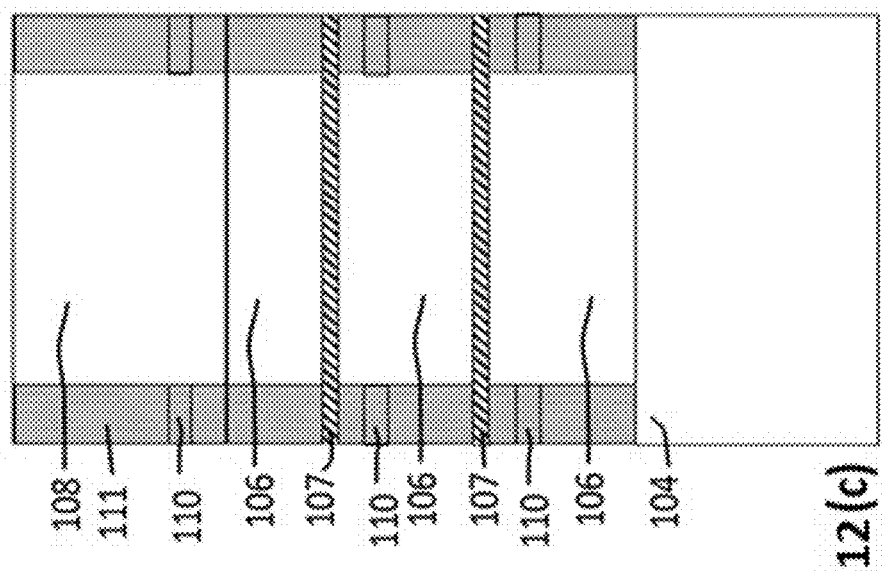
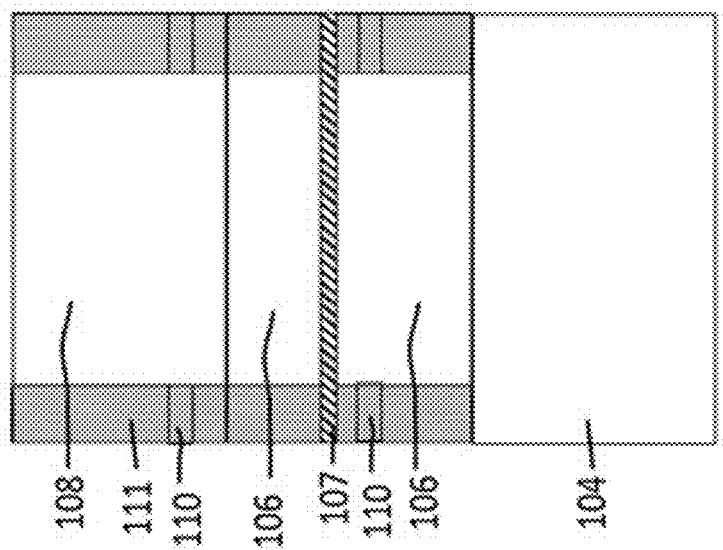
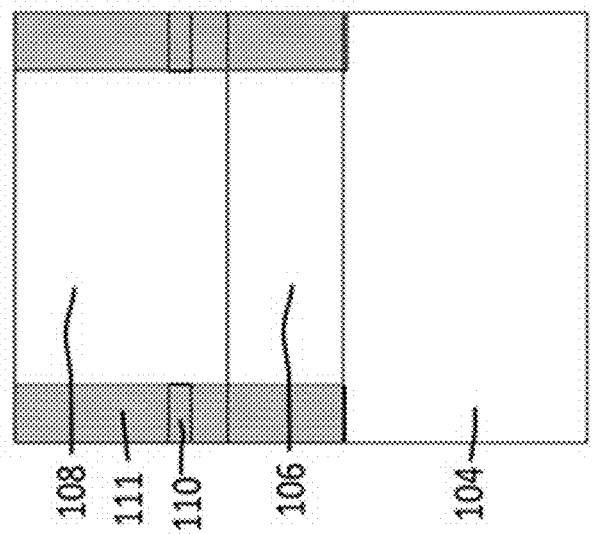
FIG. 12(a)
FIG. 12(b)
FIG. 12(c)

VCSEL DEVICE WITH MULTIPLE STACKED ACTIVE REGIONS

CROSS REFERENCE TO RELATED APPLICATION

This application is a continuation-in-part of U.S. patent application Ser. No. 16/733,901, filed Jan. 3, 2020; which is a continuation of U.S. patent application Ser. No. 16/045,633, filed Jul. 25, 2018, now U.S. Pat. No. 10,530,128, issued Jan. 7, 2020; which claims benefit under 35 U.S.C. § 119(e) of Provisional U.S. Patent Application No. 62/536,918, filed Jul. 25, 2017, the contents of which is incorporated herein by reference in its entirety.

TECHNICAL FIELD

The present disclosure is related to vertical-cavity surface-emitting laser (VCSEL) arrays, and devices, methods, and systems related to series-connected architectures.

BACKGROUND

Vertical-cavity surface-emitting lasers (VCSELs) are used in a variety of communication technologies, including short-wavelength multi-mode fiber optic communication systems. VCSELs are also effective and robust in extreme temperature and radiation environments, making them useful in applications such as illuminators and industrial thermal processing. Single VCSEL devices generally operate at optical output powers of several milliwatts, especially when designed for data rates of 10 Gb/s or higher. Larger optical output powers may be attained by building simultaneously-addressed arrays of VCSELs on common substrates or on multiple substrates.

However, VCSELs are limited to modest aperture sizes as a result of current spreading losses and modal properties. In order to scale VCSELs to higher power, the usual approach is to create an array of VCSELs on a common die. The arrayed devices are often combined in parallel or series, and designed for low modulation bandwidth. In parallel arrangements, multiple VCSELs on a single substrate are typically commonly connected through the wafer, and the lasers are electrically connected in parallel with a common cathode connection. Such configurations may be found, for example, in U.S. Pat. No. 7,949,024 B2, which describes parallel configurations of back-emitting VCSEL arrays. However, additive bulk capacitance is a limiting factor for parallel operation of VCSELs, and parallel arrangements may not be the ideal impedance match to high current pulsed driver circuits. R. Carson, M. Warren, P. Dacha, T. Wilcox, J. Maynard, D. Abell, K. Otis, and J. Lott, "Progress in high-power high-speed VCSEL arrays," Proc. SPIE 9766, Vertical-Cavity Surface-Emitting Lasers XX, 97660B (18 Mar. 2016), has shown that much higher optical power can be attained by connecting multiple die in series. Each of the individual die has multiple VCSELs that are connected in parallel, but then the sub-mount that the die are flip-chip bonded to can connect the die in series.

Series-connected VCSEL arrays have been shown to greatly enhance the output optical power at a given current relative to a single parallel-connected VCSEL array, especially when operated from a low duty-cycle pulsed current source. Such high power pulsed light sources are particularly useful for applications such as flash-LiDAR and short range NIR illumination.

In many current series-connected configurations, each VCSEL array comprises a set of parallel VCSEL elements arranged on a single chip, or wafer, and a common cathode path, formed by shorted contacts, that connect to a conduction layer on the chip. Multiple chips are bonded on a common sub-mount and arranged to form a series connection. In a flip-chip arrangement, each chip's anode is connected to common electrical connections on the sub-mount, and the common cathode connection on each chip connects to the next chip's anode connection on the sub-mount arrangement. Since such configurations use a common cathode arrangement on each chip, "tiling" multiple chips on the common sub-mount has been the only way to realize a series connection configuration.

The approach of "tiling" has many advantages from the standpoint of design flexibility. However, there are configurations where using a single chip is significantly more advantageous. For example, in laser assemblies where segmented groups of micro-lenses are used, the relative alignment accuracy between those lenses is critical such that relative angular differences between the tiled chips become problematic. Another example is the case where there is a low-value current source that could benefit from the extra optical power associated with series connection, but the extra semiconductor die area required for tiling multiple die causes cost and packaging issues. Tiling also requires extra real estate, and multiple chips can lead to increased costs and packing issues. Thus, in some cases, such size, cost, and manufacturing factors outweigh the advantages of extra optical power associated with a series connection. Furthermore, since the matched properties are more likely to come from VCSEL elements mounted on the same chip, tiling may not be preferable when wavelength control requirements dictate that the VCSEL elements used in the series connection have nearly identical emission properties.

SUMMARY

High power arrays may require differential quantum efficiencies greater than 100%. One method to achieving higher slope efficiencies greater than this is to epitaxially stack more than one active region in the VCSEL while utilizing the same DBR mirrors. Multiple active region VCSELS, commonly called cascade VCSELs, stack multiple active regions and must electrically couple the active regions together utilizing a backwards tunnel junction. The backwards tunnel junction, often referred to a reverse Esaki tunnel junction, allows tunneling current to be achieved between the multiple active regions. The tunneling process is sometimes referred to as a carrier recycling process whereby carriers from one active region are injected into the next active region. As a result, higher slope efficiencies and higher power VCSELs can be achieved. However, as a result of stacked active regions, the VCSELs also require higher operating voltages.

Methods, devices, and systems are described for a series-connected, single chip, vertical-cavity surface-emitting laser (VCSEL) array. A series-connected design enables a higher peak optical power from a given current source than could be obtained with a single array connected in parallel. The single chip may comprise a semiconductor substrate and a conductive layer. The conductive layer includes one or more non-conductive regions, formed by etching through the conductive layer or by ion implantation, which create a plurality of electrically separate regions on the conductive layer. Each electrically separate region may have a plurality of VCSEL elements, including an anode region and a cathode region connected in series. The chip also connects to a sub-mount with a metallization pattern, which enables a series connection between electrically separate regions on the conductive layer. In one embodiment, the metallization pattern connects the cathode region of a first electrically separate region to the anode region of a second electrically separate region. The metallization pattern may also comprise cuts that maintain electrical separation between the anode and cathode regions on the same electrically separated layer region, and that align with the etched regions.

In some embodiments, the chip's semiconductor substrate may be a semi-insulating or insulating material. The etched regions can comprise an etch pattern with cleaved or diced edges, and may further be one or two-dimensional. The sub-mount metallization pattern can also match one or more etch patterns on the conductive layer's etched regions. The chip and the sub-mount may also be connected through flip-chip bonding or similar methods. In another aspect, the cathode region of each electrically separate region is positioned around the anode region in the same electrically separate region. Moreover, each cathode region comprises a plurality of shorted contacts. The VCSEL elements may be electrically connectable to external driver circuitry.

BRIEF DESCRIPTION OF THE DRAWINGS

The drawings are provided to illustrate example embodiments described herein and are not intended to limit the scope of the disclosure.

FIG. 11(a), FIG. 11(b) and FIG. 11(c) illustrate VCSEL embodiments comprising one or more active regions and an implant layer.

FIG. 12(a), FIG. 12(b) and FIG. 12(c) illustrate VCSEL embodiments comprising one or more active regions with a conductive layer.

DETAILED DESCRIPTION OF ILLUSTRATIVE EMBODIMENTS

Devices, systems, and methods are described herein for enabling multiple series connections of vertical-cavity surface-emitting laser (VCSEL) arrays on a single chip. Series-connected VCSEL arrays greatly enhance the output optical power from a given continuous (CW) or pulsed current source, relative to a single parallel-connected VCSEL array. The enhanced peak optical power is especially apparent when operated from a low duty-cycle pulsed current source. Such high power pulsed light sources are particularly useful for a variety of applications, including flash LiDAR or near infrared illumination.

The ability to have series connected laser array regions with various sizes and configurations on a single chip allows drive circuitry, laser configurations, and output micro-optics to be optimally matched to maximize the per-region output. Further, the flexibility and variety of VCSEL array designs enable tailoring of the overall light beam output. Since embodiments are not limited to a particular "tiling" or other arrangement on a sub-mount, manufacturing and other costs may be reduced.

In the embodiments described below, VCSELs in arrays are interconnected such that both the anode and cathode contacts are made on the active side of the wafer. In this configuration, it is possible to use a non-conducting (undoped) wafer as the device substrate, so that it is easier to electrically isolate the VCSELs. The capability to make the cathode and anode contacts to the same side of the wafer is a great advantage for packaging and integration. A single flip-chip bonding step can be used for assembly on a variety of substrates, including active integrated circuits. The direct interconnection without wire bonds minimizes parasitic inductance, enabling short, high current pulse operation.

Figure 1:
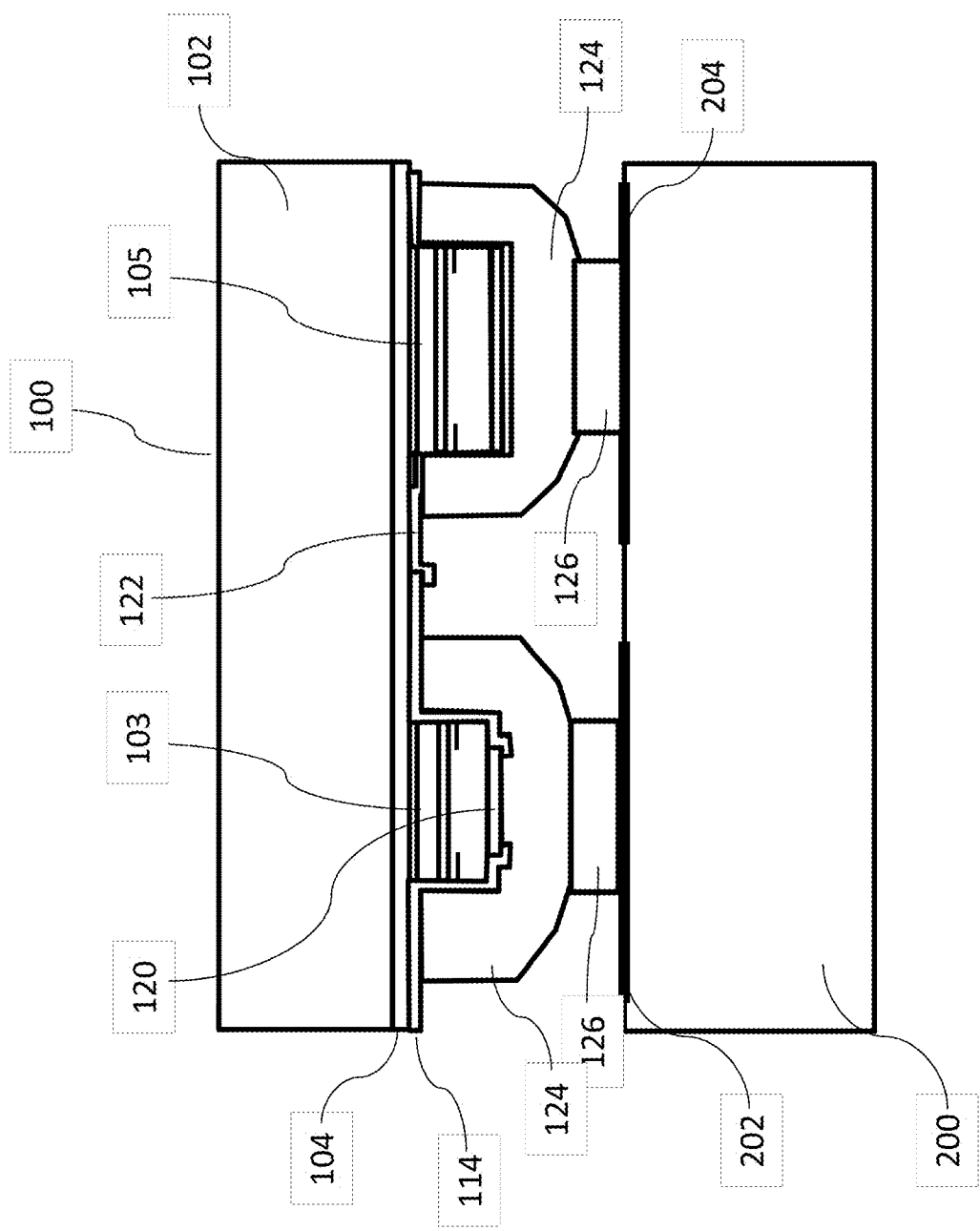
FIG. 1 is simplified cross-sectional view illustrating a flip-chip bonded, series VCSEL, paired with a shorted VCSEL structure that provides the current return path, so that the anode and cathode contacts are on the same side of a chip, in accordance with an embodiment.

In accordance with an embodiment, FIG. 1 shows a simplified schematic cross-section of a flip-chip bonded VCSEL array with anode and cathode contacts on the same side of a die. The figure shows a single laser die or chip 100 with a single laser 103 and a single shorted mesa 105 contacting the sub-mount substrate 200. However, in practice, a single chip will have many laser mesas and shorted mesas. The light-emitting laser is the mesa contacting the anode contact pad on the sub-mount 202. The mesa contacting the cathode contact pad 204 is fabricated similar to the laser mesa, but the plated metal layer 124 is in contact with the p and n-doped layers of the laser structure, creating an electrical short, so no current flows through the junction and no light is emitted. Alternatively, the plated metal layer 124 can be isolated from the p-doped layers by a dielectric coating, only contacting the n-doped material and shorting the current directly to the cathode contact, 204, on the sub-mount, 200. Again, no current flows through the junction in this embodiment and no light is emitted.

It will be understood that the methods disclosed herein can be used to fabricate arrays of other semiconductor devices, such as light emitting diodes, photodetectors, edge-emitting lasers, modulators, high electron mobility transistors, resonant tunneling diodes, heterojunction bipolar transistors, quantum dot lasers and the like. Further, it will be understood that the illustration of VCSEL array device 100 in the embodiment is for illustrative purposes only and is in no way meant to limit the scope of the invention.

In the embodiment, VCSEL array device includes a substrate 102 which commonly includes Gallium Arsenide (GaAs). However, other materials such as Indium Phosphide (InP), Indium Arsenide (InAs), Silicon (Si), an epitaxially grown material, and the like, could be used to form the substrate 102. Substrate 102 typically includes a lattice constant chosen to minimize defects in a material layer subsequently grown thereon. It will also be understood that the choice of at least one of the compositions and the thicknesses of the subsequently grown material layers will provide a desired wavelength of operation. Subsequent layers are deposited on the substrate 102 via epitaxial growth using Molecular Beam Epitaxy (MBE), Metal-Organo-Chemical Vapor Deposition (MOCVD), and the like.

In some embodiments, the semiconductor substrate 102 is doped in order to provide additional conductive material for the current return path. This additional conductive material is not necessary and the semiconductor substrate 102 can be an undoped or semi-insulating material that has very low conductivity may be used. In such a case, the cathode contact layer 104 is the key electrical connecting layer between the lasers in the array.

Layer 104 is a doped layer in the semiconductor layer structure of the VCSEL that allows lateral conduction across the substrate, 102. A metal layer 122 (See FIG. 2) makes contact to layer 104 close to the laser mesa 103 in order to reduce the electrical resistance to the current return path. The conductive cathode layer 104 connects to the plated metal structure 124 of the shorted mesas 105. In an embodiment, layer 104 may be a lattice-matched lower Distributed Bragg Reflector (DBR) epitaxially deposited on substrate 102 to form the first of the raised layers of the VCSEL mesas 103 and the short-circuiting/shorting/grounding mesa 105. The lower DBR 104 is formed from multiple layers of alternating materials with varying (a high and a low) indexes of refraction, or by periodic variation of some characteristic, such as height, of a dielectric waveguide, resulting in periodic variation in the effective refractive index in the guide. Each layer boundary causes a partial reflection of an optical wave, with the resulting combination of layers acting as a high-quality reflector at a desired wavelength of operation. Thus, while the lower DBR 104 includes more than one material layer, it is illustrated in FIG. 1 as being comprised of a single layer for simplicity and ease of discussion herein. A portion of lower DBR 104 can also be made conductive to allow an electrical contact (not shown) to be made to the VCSEL array device.

In an embodiment, an active region may be epitaxially deposited on lower DBR 104, wherein the active region comprises cladding (and/or waveguiding) layers, barrier layers, and an active material capable of emitting a substantial amount of light at a desired wavelength of operation. The wavelength of operation is a wavelength within a range approximately given from about 620 nm to about 1600 nm (for a GaAs substrate). However, it will be understood that other wavelength ranges may be desired and will depend on the application.

As is understood by those skilled in the art, the wavelength of emission is substantially determined according to the choice of materials used to create the DBR and the active region. Further, the active region may include various light emitting structures, such as quantum dots, quantum wells, or the like. An electrically conductive upper DBR region may be positioned on the active region to allow ohmic electrical connections to be formed (not shown). In some embodiments, lower DBR 104 is n-doped and upper DBR is p-doped, but this can be reversed, where lower DBR 104 is p-doped and upper DBR is n-doped. In other embodiments, electrically insulating DBRs can be employed (not shown), which utilize intra-cavity contacts and layers closer to the active region. Further, a doped upper mirror contacting layer (not shown) can be positioned on the upper DBR to facilitate ohmic electrical connection to a metal deposited on the contacting layer, 120.

Lithography and etching can be used to define each mesa and their structures described above. This can be achieved by patterning the epitaxially-grown layers through a common photolithography step, such as coating, exposing, and developing a positive thick resist. The thickness of the resist can be varied as is known in the art, depending on etch-selectivity between the resist and the epitaxial layers, and the desired mesa geometry.

For GaAs-based materials, etching is usually accomplished using a Chlorine (Cl) based dry etch plasma, such as $Cl_2:BCl_3$, but any number of gases or mixtures thereof could be used. Etching can also be accomplished by many wet etchants. Other forms of etching, such as ion milling or reactive ion beam etching and the like can also be used. The depth of the etch is chosen to be deep enough to isolate the active regions of mesas in the array. The etch stops either on the N mirror (lower DBR 104), an etch stop/contact layer formed in the N mirror (lower DBR 104), or through the N mirror (lower DBR 104) into the substrate 102. After etching to form the mesas, the remaining photoresist is removed. This can be achieved using a wet solvent clean or dry Oxygen ($O_2$) etching or a combination of both.

In the embodiments shown in the Figures, the mesa size, and apertures of the light producing VCSELs are the same and have uniform spacing. However, in some embodiments, the individual VCSEL mesa size for the devices in an array can differ. Furthermore, the VCSEL mesa spacing in the array can differ. In some embodiments, the separation of the light producing VCSELs mesas in an array 100 is between approximately 20 μm and 200 μm. However, larger and smaller separations are also possible. Both the VCSEL mesas and the cathode mesas are shown as circular in the figures, but may be rectangular, elongated lines or other arbitrary shapes.

Dielectric deposition can be used and processed to define an opening for a contact surface. The dielectric layer 114 insulates the laser mesa 103 from the plated metal covering and heat sink 124 so that current flow from the anode contact 202 will flow through the metal layer 126, 124, and 120, and then through the semiconductor junction so that light is emitted. Deposition of the dielectric layer 114 is usually accomplished by Plasma Enhanced Chemical Vapor Deposition (PECVD), but other techniques, such as Atomic Layer Deposition (ALD), can be used. In the embodiment, the dielectric coating 114 is a conformal coating over the upper surface (including the mesa sidewalls) and is sufficiently thick so as to prevent current leakage through pinholes from subsequent metal layers.

Other properties to consider while choosing the thickness of this film is the capacitance created between the plated metal 124 (which operates as a heat sink as further described below with reference to FIG. 2) and the substrate 102 (ground), where the dielectric layer 114 would be more beneficial to be thicker, and the need for the dielectric layer 114 on the sidewalls of the VCSEL 103 to transfer heat from the active region to the heat sink 124, where a thinner layer would be beneficial. In some embodiments, multiple depositions using different deposition techniques can be used to accomplish a layer with both of these properties. An example of this technique is to follow a deposition of PECVD Silicon Nitride (Si3N4) with an E-beam deposition of Si3N4, or another dielectric could be deposited that has a more directional deposition rate, thereby putting thicker dielectric material on the incident surfaces. Once the dielectric layer 114 has been formed, a photolithographic process is then used to define openings in the dielectric over each of the VCSELs mesas where contact is to be made to the top mirror contact layer 120. The dielectric layer 114 is also removed over the substrate 102 between each of the VCSEL mesas, over the substrate 102 surrounding the ground mesa, and over the top and side of each ground mesa.

In these exemplary embodiments, a photolithographic process may be used to define the contacts over the top mirrors where the dielectric is opened, so that a p-metal layer 120 can be formed therein in a subsequent step. In the embodiment, the opened area in the photoresist is slightly larger than the opening in the dielectric, typically of the order of a few µm wider. In other embodiments, its diameter can be smaller than the diameter of the dielectric opening, or as large as the diameter of the heat sink material over the shorted mesas, which is plated at a later step. This opening could not be any larger than the mesa diameter in an active light producing mesa or the subsequent metals would short out the p- and n-potentials, unless the dielectric coating is conformal and covering the N mirror portion at the mesa base.

Once the opened areas in the photoresist are defined, metallization can be performed, typically with a p-type metal, over the opened areas. The p-metal contact layer 120 is usually a multilayer deposition that is deposited by E-beam, resistive evaporation, sputter, or any other metal deposition techniques. A thin Titanium (Ti) layer is first deposited for adhesion of the next layer. The thickness of this adhesion layer can vary greatly, but is generally chosen to be between about 50 Å and about 400 Å as the Ti films are stressful and more resistive than the subsequent layers. In an embodiment, the adhesion layer is approximately 200 Å thick. Other adhesive metal layers can be substituted for this layer such as Chromium (Cr), Palladium (Pd), Nickel (Ni), and the like. Also, this layer can serve as a reflector layer to increase reflectance of the contacting mirror.

The next layer is deposited directly on top of the adhesion layer without breaking vacuum during the deposition. In many cases this layer acts as a guard against the Gold (Au) or other top metals from diffusing too far into the contact (a diffusion barrier) because of excessive heating at the bonding stage. Metals chosen are generally Pd, Platinum (Pt), Ni, Tungsten (W), or other metals or combinations of these metals chosen for this purpose. The thickness chosen should depend upon specific bonding temperatures needed in the flip chip process. The thickness of this layer is typically between about 1,000 Å and about 10,000 Å. In embodiments where a low temperature bonding process is used, for example, in an Indium bonding process, a diffusion barrier layer can be optional, and not deposited as part of the metal contact stack.

The next layer is generally Au but can be Pd or Pt or mixtures such as Gold Beryllium (AuBe) or Gold Zinc (AuZn). In the embodiment described below, the thickness of this layer is approximately 2,000 Å. However, it can generally have a wide range of thicknesses depending on the photo resist properties and heating characteristics of the deposition. In some embodiments, another metal can also be deposited at this time to increase metal thickness and to form the metal heat sink at this stage, thereby reducing the number of processing steps, but this technique is not necessary and was not utilized in the demonstration devices described below.

Generally, a common liftoff technique is chosen for this photolithographic process so that the metal deposited on the surface can easily be separated from the areas of the surface covered with photoresist, such that any metal on the photoresist is removed without sticking to or affecting the adhesion of the metal to the semiconductor. As noted above, a photolithographic process is then used to define the openings over various portions of the substrate 102 and the shorted n-contact mesas 105, where the dielectric was opened in a previous step. In an embodiment, the opened area in the photoresist corresponding to the n-metal deposition should be slightly larger than the opening in the dielectric openings for the n-metal. N-metal layer 122 is then deposited and can form an electrical circuit with the substrate 102 either through the lower DBR 104 (if an n-mirror), an etch stop and contact layer which is generally heavily doped within lower DBR 104, or to substrate 102 itself. The process to form the n-metal layer 122 is similar to that for the p-metal layer 120. The metal layers can be chosen to include the combinations of Ni/Ge/Au, Ge/Au/Ni/Au, or many such combinations.

In some embodiments, the first layer or layers are chosen to reduce contact resistance by diffusion into the n-doped epitaxial material of the substrate 102. In other embodiments, the first layer of the multi-layer metal stack can also be chosen as a diffusion-limiting layer such as Ni so that in the annealing process the metals do not "clump" and separate due to the various diffusion properties of the materials. Evenly distributing diffusion of these metals is desired and can be used to lower the contact resistance which also reduces heating. The thickness of this multi-layer metal stack can vary greatly. In the embodiment to be described, a Ni/Ge/Au metal stack with thicknesses of 400 Å/280 Å/2,000 Å, respectively, was used.

A Rapid Thermal Anneal (RTA) step is then performed on the wafer in order to lower contact resistance. For the embodiment described, the process temperature is rapidly ramped up to ~400° C., held for about 30 seconds and ramped down to room temperature. The temperature and time conditions for the RTA step depend on the metallization, and can be determined using a Design Of Experiment (DOE), as known to those of ordinary skill in the art.

In other embodiments, this step can be performed at an earlier or later stage of the process flow, but is generally done before solder is deposited so as to reduce oxidation of the solder or adhesive metal. A photolithographic process (using a thin layer of photoresist, typically around 1 µm to 3 µm, is used and developed to define the contact openings over the substrate 102 and shorted N contact mesas 105, and active mesas 103 where the heat sink structures will be plated or built up. The next step is deposition of the metal seed layer and is usually a multilayer deposition and deposited by E-beam, resistive evaporation, sputter or any other metal deposition techniques. The metal layers can be chosen such as Ti/Au, 20 Å/600 Å, or many such combinations where the first layer or layers is deposited for adhesion and ease to etch off, and the second layer for conductivity and ease to etch off. The seed layer is continuous over the surface allowing electrical connections for plating, if this technique is used for building up the heat sinks.

In an embodiment, a thick metal is then deposited by plating, to form heat sink 124. However, other methods of deposition can also be used, in which case the metal seed layer is not required. For plating, a photolithographic process is used to define the openings over the openings defined with the previous seed layer resist. The photoresist is removed in the areas where the deposition will occur. The thickness of the photoresist must be chosen so that it will lift off easily after the thick metal is defined and typically ranges in thickness from about 4 µm to about 12 µm. A plasma clean using O2, or water in combination with Ammonium Hydroxide, (NH4OH), is performed to clear any of the resist left on the gold seed layer. The heat sink 124 metal is plated next by means of a standard plating procedure. In the embodiment described, Copper (Cu) was chosen as the metal for plating due to its thermal conductance properties, but non-oxidizing metals, such as Au, Pd, Pt, or the like, that provide good thermal conductance and provide an interface that does not degrade device reliability, could be more appropriate. Plating thicknesses can vary. In the embodiment described, an approximately 3 µm thickness was used.

Next the wafer or sample is placed in a solder plating solution such as Indium (In) plating to form a bonding layer 126. Other metals can be chosen at this step for their bonding characteristics. The thickness can vary greatly. In the embodiment described, approximately 2 µm of plated In was deposited on the heat sinks. However, other solders such as Gold Tin (AuSn) alloys can also be used, and alternative deposition techniques such as sputtering can also be used. After metal deposition is complete, the photoresist is then removed using solvents, plasma cleaned, or a combination of both, as previously described, and the seed layer is etched with a dry or wet etch that etches Au, then etched in a dry or wet etch that etches Ti and/or removes TiO2. The seed layer photoresist is then cleaned off with standard resist cleaning methods. At this point, the VCSEL array substrate is complete and ready for bonding. Alternatively, the solder may be deposited on the sub-mount contact surfaces for the flip-chip bonding process instead of the mesas on the laser die.

The full encasement of the mesas with a thick heat sink material is an important aspect of the embodiment. Since the active regions of the mesas are closest to the edge where the thick heat sink material is formed, there is good thermal conductance, thereby enabling the design of the embodiment to efficiently and effectively remove heat generated by those active regions. As previously noted, this is a significant departure from existing VCSEL array device heat reduction techniques, which place the heat sink material on top of the mesa. These existing or prior designs require heat to move through a series of higher thermally conductive materials (mirrors) or dielectrics, thereby resulting in less efficient and effective heat reduction.

Although some existing designs encompass the mesa with a thin layer of heat sink material, for the purpose of reducing heat, these designs do not take into the consideration the height of the resulting heat sink. By using a thick heat sink layer and adding to the distance between the n-substrate ground potential and the p-contact plane on the heat sink substrate, present embodiments decrease parasitic capacitance of the system as the height of the heat sink layer is increased. Further, in addition to reducing heat, the build-up of additional material increases frequency response.

In another embodiment, the dielectric layer 114 covers the entire n-mirror or substrate around the mesas and is not opened so that the heat sink material can completely encompass all mesas and form one large heat sink structure, instead of individual mesas of heat sinks. In this case, the n-contacts would only be needed to extend from the short circuited mesas to the substrate. The heat sinks of the embodiment also improve the operation of the VCSEL array by reducing the amount of heat generated by neighboring mesas. A reduction in thermal resistance within most electrical devices will increase the frequency response of each device. By improving the thermal performance of the VCSEL array device of the present device, a significant increase in the high speed performance of the VCSEL array device is made possible. Furthermore, in this embodiment it is also evident that the extra height given the mesas, because of the thickened heat sinking build up compared to the existing array circuits, reduces capacitance by increasing the distance between the substrate ground plane and the positive contact plate connecting all active mesas in parallel. The resultant effect is a reduction in parasitic impedance of the circuit which also increases the frequency response of the entire array.

Also, the short circuited mesa design, which forms a sub-array surrounding the active regions, allows current flow directly from the fabricated VCSEL substrate to the ground plane on the heat spreader without the use of forming multiple wire bonds. This aspect of the embodiment reduces the complexity of fabrication, and also reduces parasitic inductance from the multiple wire bonds exhibited in the existing arrays. The short circuited mesa design, when flipped chipped to the heat spreader substrate, forms a coplanar waveguide which is beneficial to the frequency response of the array. This design feature also enables simpler packaging designs that do not require raised wire bonds, which also impact reliability and positioning.

Layer 126 is a solder or other conductive bonding layer that provides adhesion to the sub-mount substrate, 200. Layer 126 can be deposited on top of the plated metal, layer 124, on anode and cathode mesas directly by a variety of methods. Layer 126 can also be applied to the anode and cathode contact pads 202 and 204 on the sub-mount instead. Layer 120 is the contact to the highly-doped surface of the VCSEL semiconductor layers. The current flow from the laser mesa to the shorted mesa, to make the path to ground at the cathode contact, 204, is through the cathode contact layer 104.

Figure 2:
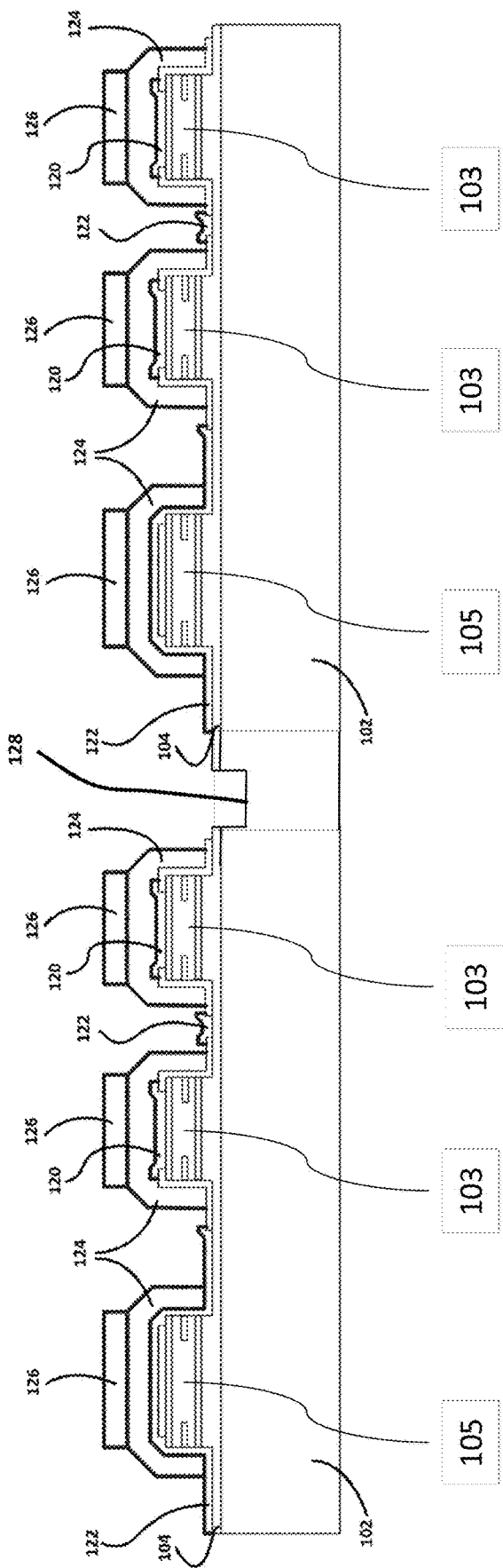
FIG. 2 is a simplified cross-sectional view of two series-connected VCSEL arrays, further illustrating the shorting mesa devices, heat sinks, bonding layers, and other features in accordance with an embodiment; wherein electrically separate regions are formed through a trench isolation or ion implant region.

A preferred layout of such a series-connected arrangement is shown in the cross-section of FIG. 2. Here, the anodes 103 and shorted cathodes 105 of the laser array are constructed as previously shown in FIG. 1. One difference is that semiconductor substrate 102 is at least a semi-insulating material (i.e., semi-insulating or insulating), rather than commonly used highly doped conductive semiconductor material. This semi-insulating material is a low-doped version of the GaAs substrates that form the basis for most VCSEL designs. Also, the common conductive cathode layer 104 is separated using an etched region 128 to create electrically separate cathode regions on the chip.

An alternative embodiment uses an isolation implant in region 128 instead of the etched trench. The implant would be performed after the mesas in the figure are etched, so that the implant energy would not need to be extremely high, as would be needed to implant through the entire laser structure. The isolation implant typically uses protons to disorder the semiconductor crystal structure and make it non-conducting. There are many approaches to implant species and energies to do such an electrical isolation that are known to those skilled in the art. A combination of a shallow-etched trench in region 128 combined with an isolation implant may also be used.

Figure 3:
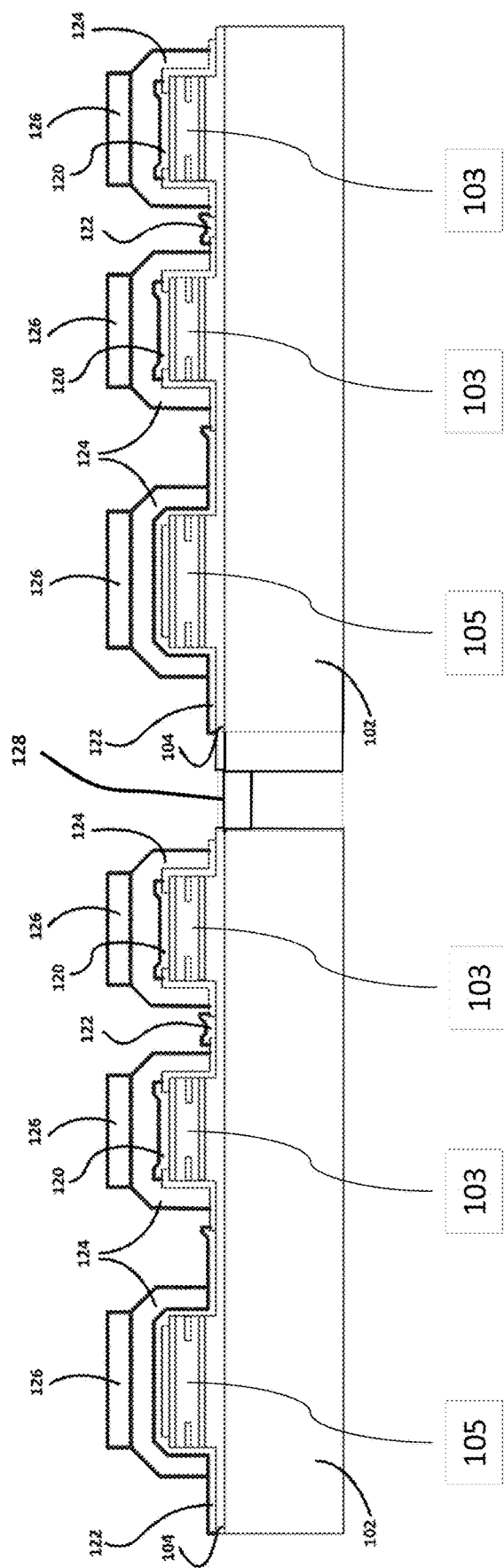
FIG. 3 is alternative embodiment of two series-connected VCSEL arrays, wherein electrically separate regions are formed through an ion implant and a trench isolation through the substrate method.

FIG. 3 depicts a similar series-connected arrangement as FIG. 2, but the isolation between the VCSEL arrays are realized through a trench isolation method. In this embodiment, the substrate is etched from the back, in order to create electrically separated conductive regions on the common conductive cathode layer. The trench in region 128 does not go through the entire substrate 102 but is deep enough to allow use of ion implantation to make the remaining material in region 128 non-conductive. The trench will weaken the wafer mechanically, so a support substrate of some type may be needed.

The trench may be formed using the lithographic techniques, as described above, to etch the substrate 102. Common isolation techniques, such as filling the trench with a dielectric material such as polymer or spin-on glass to create structures similar to local oxidation of silicon (LOCOS) or shallow trench isolation, may be implemented to create a trench with the desired sizing properties, in accordance with the materials used for the VCSEL device and substrate 102, and various embodiments described herein.

Once a trench region 128 is established, ion implantation techniques may be used to ensure the region 128 is non-conductive. In ion implantation, high-energy ions (~10-200 KeV) may be accelerated into the substrate to displace atoms in the target material, cause a structural change, and result in the target material having altered physical, chemical, and/or electrical properties. Dopant ions such as boron, nitrogen, or phosphorous may be utilized in such methods, although other ions may be used, depending on the substrate properties desired and substrate material.

In one technique, as known to those commonly skilled in the art, ion implantation may be implemented through formation of an ionized beam comprising the desired element and inert gases. The ionized beam is accelerated in a vacuum at high energies towards the target material, where the ionized atoms may displace atoms in the target material. To accomplish this process, high energy accelerators and other techniques common to those skilled in the art may be utilized. A Rapid Thermal Anneal (RTA) step may also be performed on the chip to eliminate defects or damage caused by dopants and impurities during the implantation process.

Ion implantation techniques may be preferable for creating the non-conductive trench regions 128 since the electric properties of the region may be precisely controlled through the depth and dosage of the implants. Implantation also contributes to hardening of the surface target material and corrosion resistance, which makes the device more resistant to wear and other damage.

A combination of trench etching through the conductive region of the VCSEL structure (as shown in FIG. 2) and partially through the substrate (as shown in FIG. 3), combined with isolation implants into the remaining material in region 128 would also allow use of doped (i.e. conductive) substrates to make series connection of VCSELs on the same die.

Figure 4:
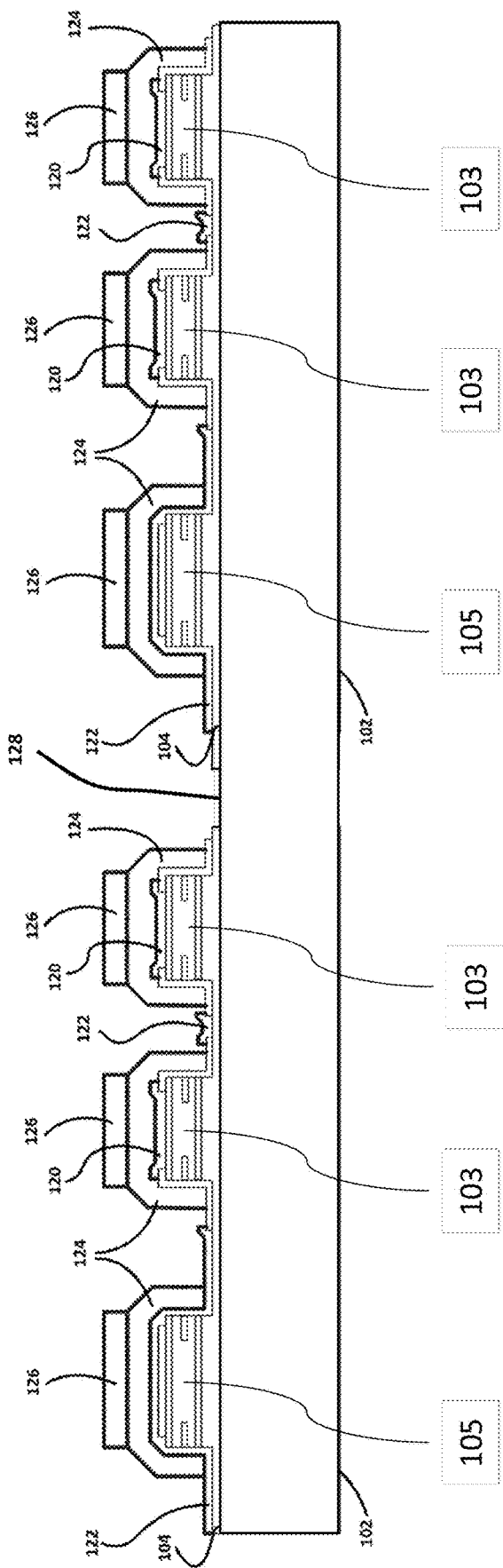
FIG. 4 is alternative embodiment of two series-connected VCSEL arrays, wherein electrically separate regions are formed by etching through the conductive layer and removal of the semiconductor substrate material and replacement with an insulating support substrate.

FIG. 4 illustrates a third approach to electrically isolating the VCSELs on the same die for a series connection. In this approach, the doping of the substrate 102 is irrelevant, since the substrate is removed and the VCSEL array structures are supported by an insulating substrate that is bonded to the exposed surface of the VCSEL arrays after the original gallium arsenide substrate has been removed by a combination of abrasive action, selective chemical etching, and/or lithographic methods, as described above. The chip is mechanically supported by a temporary backing or handle wafer bonded to the etched mesa side of the chip during the substrate removal. Once the insulating substrate is bonded in place (using adhesive or other chip bonding processes) the temporary backing chip is removed. The VCSEL arrays are then electrically isolated from each other.

Figure 5:
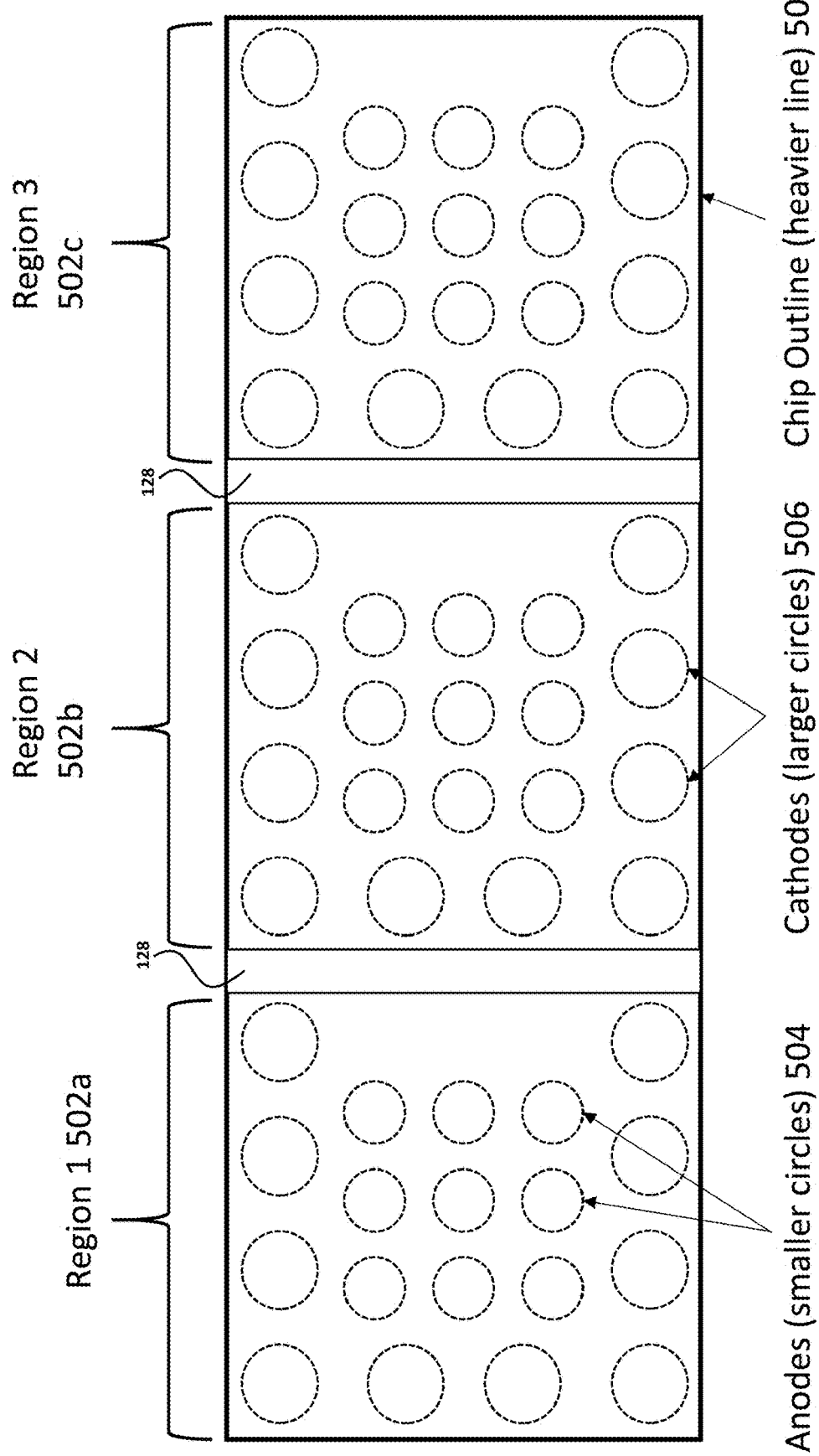
FIG. 5 is a top view of an exemplary layout of three VCSEL arrays connected in series on a single chip or die.

FIG. 5 illustrates an exemplary top-view layout of multiple VCSEL arrays connected in series on a single chip or die. The chip is represented by the solid rectangular outline 500. In this embodiment, two regions 128 extend across the chip to form three consecutive electrically separated conductive regions, 502a, 502b, and 502c, on the chip's common conductive cathode layer. The isolated regions 128 may be etched or ion implanted, through any of the methods described above, to make the regions non-conductive. Each electrically separated conductive region 502 further comprises an anode region and a cathode region. The anode region comprises a plurality of anode contacts 504, represented by the smaller dashed circles. The cathode region also comprises a plurality of cathode contacts 506, represented by the larger dashed circles.

In this embodiment, the anodes are grouped together in the center of each chip region 502. The cathode contacts 504 form a C-shape around the plurality of anode contacts 504 and substantially surround three sides of the anode contacts. However, other cathode and anode configurations are possible and are not limited to the current exemplary layout. The anode contacts 504 are electrically connected with the cathode contacts 506 within a same electrically separated conductive region. When the chip is connected to a sub-mount, the cathodes contacts connect to anode contacts of an adjacent region through the sub-mount's metallization pattern (not shown) on the bottom side of the chip, as further described in FIG. 6.

The etched regions 128, which extend across the width of the chip 500, electrically separates the cathode sub-mount layer on each region from cathode layers on adjacent regions by the etched region 128. The etched region may be achieved and defined by photolithographic processes similar to those described above, in order to create one or more separate, non-connected metal layers on the chip 500. The etched regions may comprise one or two-dimensional patterns, or any variations of the patterns described herein and may be ion-implanted regions or a combination of etched trench and ion-implanted regions.

Furthermore, the chip 500 may be any shape or size consistent with enabling the disclosed features, and is not limited to the depicted rectangular embodiment in FIG. 5. Chips may be formed by cleaving, dicing, laser singulation, or any combination of those or similar processes. Likewise, the shape, size and number of regions created on each chip can be varied, depending on design needs and similar considerations.

The arrangement of cathodes and anodes on each region may be varied to achieve the described connection patterns. The plurality of cathode solder bumps 506 are on a layer separated from the anode plurality on the same region. Cathode layers between regions are electrically separated such that the inter-region connections occur between the anode plurality on one region, and the cathode plurality on the adjacent region. Anodes 504 within each region are connected to the common cathode connection 506 within its same region through the common cathode contact layer, layer 124 in FIG. 1, so that current flows through the Anode 504 and the laser diode junctions (emitting light in the process) and then through the common cathode layer, 124 to the cathode contact.

Figure 6:
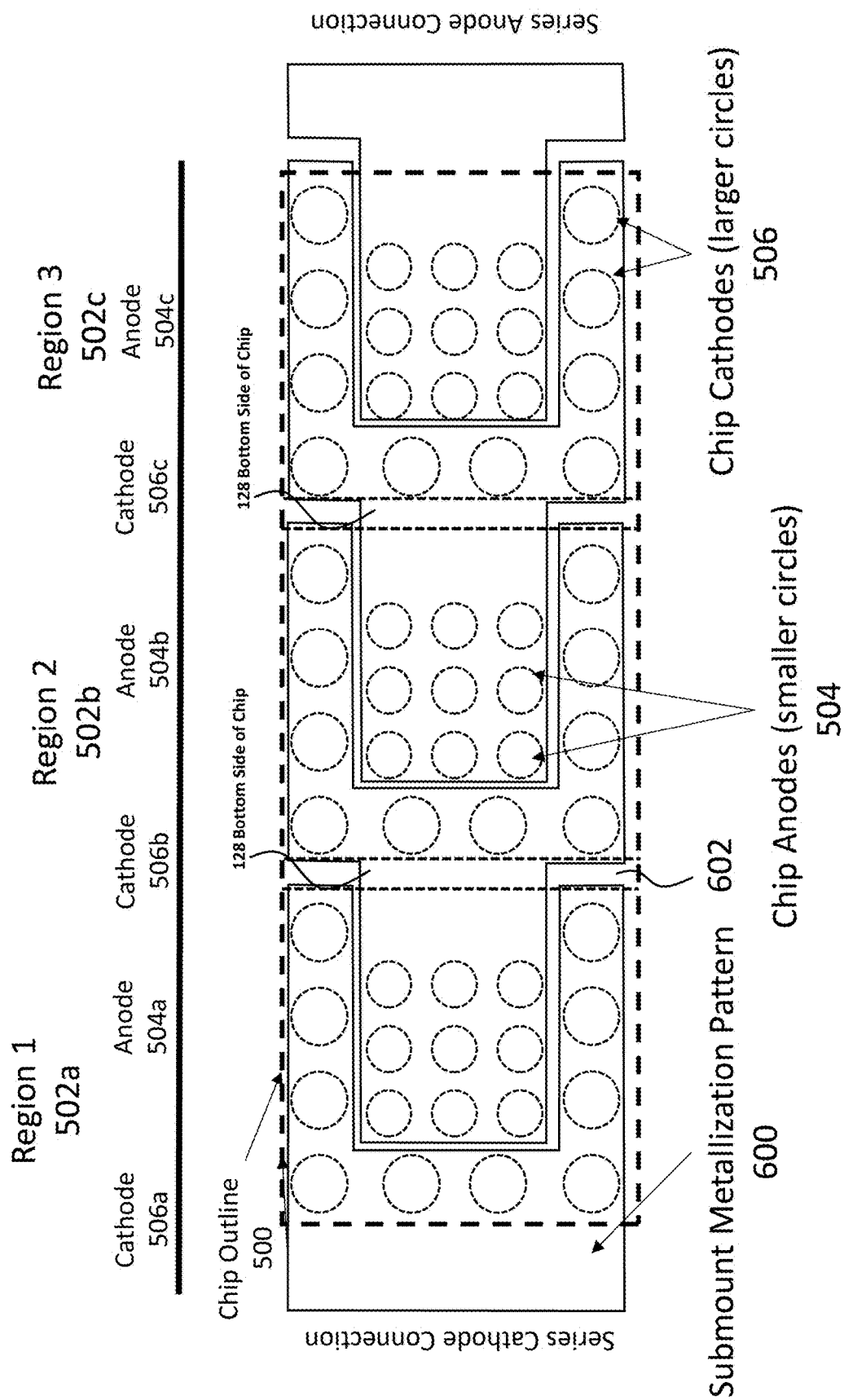
FIG. 6 illustrates the series-connected, single chip array of FIG. 5 connected to a sub-mount with an exemplary metallization pattern.

The series-connected VCSEL array design is further illustrated in FIG. 6, which depicts a bottom view of the exemplary layout in FIG. 5. In this embodiment, a patterned sub-mount is used to implement the series connection of each electrically separate region 502. Specifically, the sub-mount's metallization pattern provides a conductive electrical path between the anodes and cathodes of different chip regions, while maintaining electrical separation between cathodes in separate chip regions, and cathodes and anodes on the same chip region 500.

The connection may be realized through flip-chip bonding, wherein the laser die, as described in FIG. 2, is placed face-down onto a sub-mount substrate. The sub-mount and laser die are precisely aligned to enable desired electrical connection paths and maintain proper electrical separation between regions. Flip-chip bonding provides numerous advantages compared to wire-bonded devices. The main advantage is design flexibility, as there is a greater potential for connections. Compared to wire bonding, since more connections can be made per chip region, smaller and more varied configurations may be realized. There are also significantly less electromagnetic emissions compared to wire bonding. Shortened signal paths, and reduced inductance and capacitance of connections leads to improved electrical performance of the device, including higher speeds. Further, since heat sinks are directly attached to the chip (or die) in flip-chip bonding, improved heat transfer characteristics can be realized. These improvements can lead to economic advantages, and reductions in material, manufacturing, and production costs.

In the flip-chip process, chips may be bonded using a thermally cured epoxy layer for adhesion. The adhesive may be any number of materials, depending on design, spacing, or thermal considerations. For example, anisotropic conductive materials or non-conductive materials may be used for the adhesive bonding process. As the chip is attached to the sub-mount, and the metallization pattern is precisely aligned, electrical connections may be realized through gold contacts.

In the depicted embodiments, the anodes 504 and cathodes 506 are laid out identically to the chip arrangement in FIG. 5. The shaded patterned region 600 represents the sub-mount metallization pattern. The chip 500, outlined by dashed lines, is mounted onto the sub-mount 600. Thus, the cathode and anode solder bumps on each region contact the sub-mount, through which they may be electrically connected. The sub-mount 600 functions to assist in connecting the cathodes and anodes within each region, while providing connections to electrical elements in consecutive regions.

As illustrated, the anodes 504*a* of region 1 connect to the cathodes 506*b* in region 2, through the common sub-mount layer. Likewise, the anodes 504*b* in region 2 connect to the cathodes 504*c* in region 3. As described above, the cathodes and anodes on the same region are connected as well by the cathode common contact layer, 124, but the current must flow through the laser diode junction in the anode mesas, as described earlier.

The metallization pattern 600 comprises gaps 602 which separate anode and cathodes on each region, and closely align with the etched regions 128 on the laser die, 500. Similar to the etched regions 128, the metallization pattern gaps 602 serve to keep cathode regions electrically separate. As such, in the current embodiment, the combination of etched regions 128 and gaps 602 create three electrically separate regions on the chip 500. The described connections between anodes and cathodes on each region result in a series-connection of the three parallel arrays of diodes. This is depicted as a series connection of three diodes in FIG. 6.

While one chip is depicted in the present exemplary embodiment, multiple chips, or dies, may be connected in series. For example, several chips similar to those described in FIGS. 5-6 may be connected. Anodes on a separate chip may be connected, through the common sub-mount metallization pattern 600 to the cathodes 506*a*, depicted on present chip 500. Likewise, anodes 504*c* on the present chip may be connected to a separate chip's cathode. Moreover, individual or groups of the plurality of VCSELs may be electrically connected to external driver circuitry.

Figure 7:
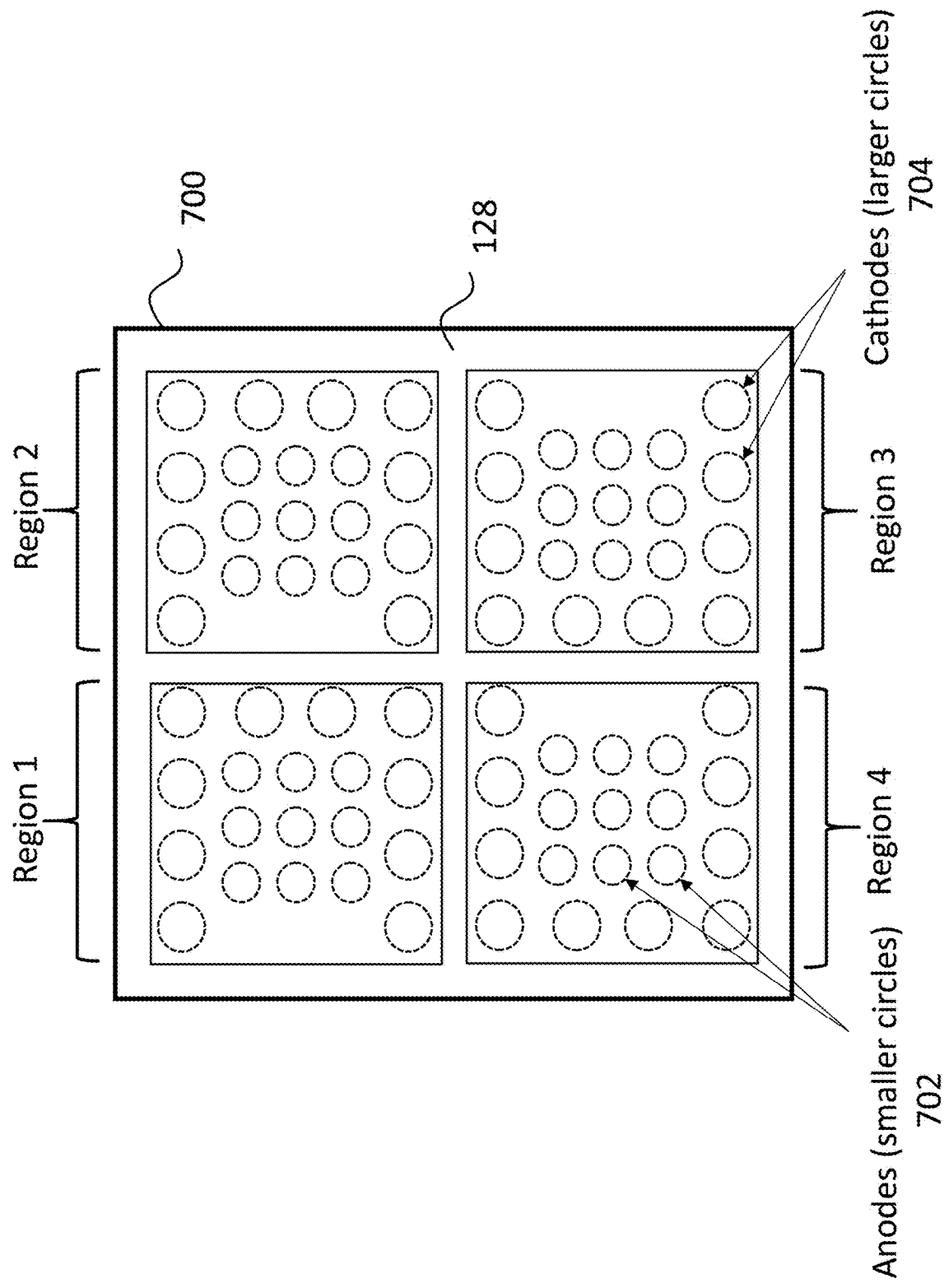
FIG. 7 is a top-view of an exemplary layout of four VCSEL arrays connected in series on a single chip or die.

FIG. 7 illustrates an alternate embodiment for a series-connected VCSEL array. In this example, four electrically separated regions are placed on a die such that two sides are adjacent to an electrically separate conductive region. The chip 700 may be comprised of GaAs or any similar material, as discussed above.

Similar to the arrangement in FIGS. 5-6, the anodes 702 are represented by the smaller dashed circles and are grouped together and placed in the interior portion of each square region. The cathodes 704, represented by the larger dashed circles, are positioned around the plurality of anodes 702 in each region. Again, the cathodes form a C-shape around the anode plurality, and substantially surround the anodes on three sides. In this four-in-series arrangement, the C-shaped cathode orientation in regions 1 and 2 is reversed from the orientation in regions 3 and 4. Specifically, the open portion of the cathode plurality faces the opposite side of the chip. This orientation is beneficial for flip-chip placement on the exemplary sub-mount metallization pattern described in FIG. 8.

Further, the cathode and anode connection pattern is similar to FIG. 5. For example, the cathodes 704 on region 1 are connected to anodes 702 on the same region through the laser diode junctions in the laser die, 700. Through the sub-mount (not shown), the cathodes 704 of region 1 connect to the anodes 702 on the electrically separate region 2. Likewise, the cathode and anodes on region 2 are connected through the laser diode junctions, and the anodes on region 3 are connected to the cathodes on region 2 through the sub-mount. A similar connection pattern is realized on regions 3 and 4 so that each region on the chip 700 is connected in series, thus creating the four-in-series VCSEL arrangement.

In this embodiment, the etched area 128, which electrically separates each region, is patterned in two dimensions. The etched area extends along the length and width of the chip, as well as the perimeter, so that each side of the four regions is electrically separate from any adjacent or other regions on the chip 700. Such two-dimensional etching patterns allow regions on the die to be placed in arbitrary arrangements with respect to each other. Thus, various region shapes, size, numbers, and positions may be realized to create many alternative series connection patterns. Therefore, it will be understood that while the illustrative embodiments illustrate a three-in-series and four-in-series arrangements of VCSEL arrays, the present invention is not limited to such examples.

Additionally, the arrangement of cathodes and anodes on each region are not limited to the depicted exemplary arrangement. Their positions and grouping may be varied according to region and/or chip size, position, the sub-mount metallization pattern, design purpose, or other similar considerations.

Figure 8:
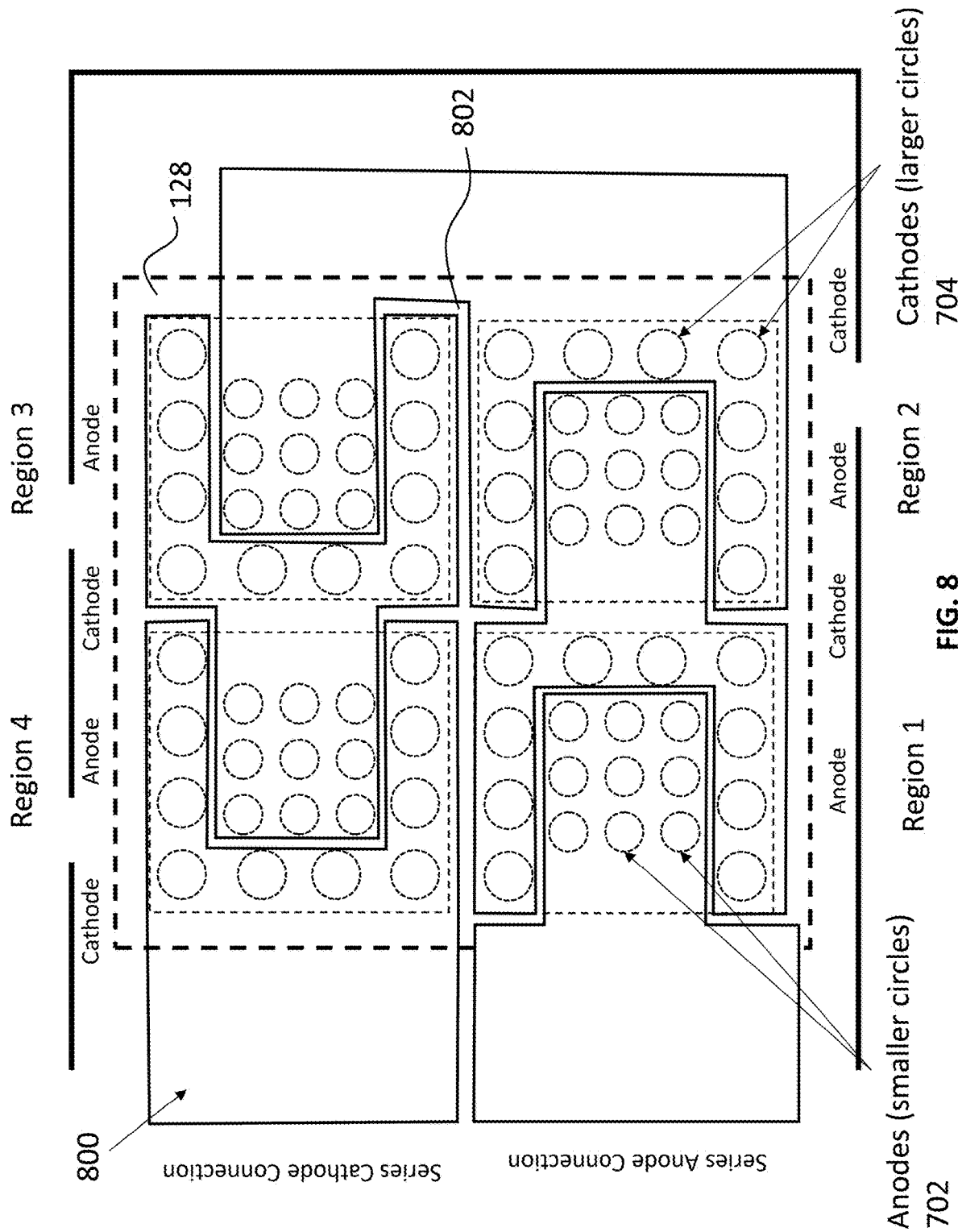
FIG. 8 illustrates the series-connected, single chip array of FIG. 7 connected to a sub-mount with an exemplary metallization pattern.

FIG. 8 depicts a bottom-view of the connection pattern and flip-chip bonding of the chip 700 to a sub-mount 800 to accomplish the four VCSEL series arrangement described in FIG. 7. The metallization pattern on the sub-mount 800 is depicted as the shaded region, and connects the cathode plurality in each region to the anode plurality in the next region, similar to the metallization sub-mount described in FIG. 6 for the three-in-series arrangement.

The metallization pattern comprises gaps 802 between anode 702 and cathode 704 pluralities on each of the four laser regions. Moreover, the gaps align with the etched region 128 so that each region's cathode layer remains electrically separated from other regions' cathode layer. The metallization pattern is not limited to the present design and may be varied, according to chip size, shape, or design, real estate, or other considerations.

The present embodiment and described connection patterns can also be extended to multiple other arrangements. They may include additional laser junctions connected in series to match with various pulsed drive circuits and maintain the alignment and real estate advantages of a single chip approach. Solder 126, for electrical and mechanical connections can either be on the laser mesas as in FIGS. 2-4, or on the sub-mounts metal patterns. FIGS. 9-12 illustrate various VCSEL embodiments comprising one or more active regions, and features in accordance with embodiments discussed herein. In these embodiments, an active region 106 may be a single active region or alternatively, multiple active regions stacked epitaxially to form a multiple active region VCSEL. In embodiments, the multiple active regions may be referred to as a bipolar cascade VCSEL, and be implemented in order to increase output power, obtain an increased quantum efficiency, reduce threshold current, and achieve a higher gain.

In embodiments, a plurality of multiple active regions, NA, can be stacked where NA is the number of multi-quantum well (MQW) regions in the VCSEL. NA can range from just one MQW region up to multiple stacked active regions consisting of two active regions, three active regions, or a multitude of stacked active regions. Each active region MQW can be made of the same or different bandgap MQW. Different MQW regions allow a broader temperature range by having each active region have a different gain offset. In embodiments, a VCSEL device with multiple active regions may require a higher operating voltage depending on the number of stacked active regions.

In various embodiments, a reverse tunnel junction (sometimes referred to as Esaki tunnel junction) can be used to electrically connect each active region and result in carrier recycling. A formation of the tunnel junction requires very high doping levels to allow carrier transportation through tunneling across the reverse junction. Thus, in order to minimize optical loss due to free carrier absorption, the tunnel junction is often situated at an optical null in the VCSEL standing wave.

Figure 9A:
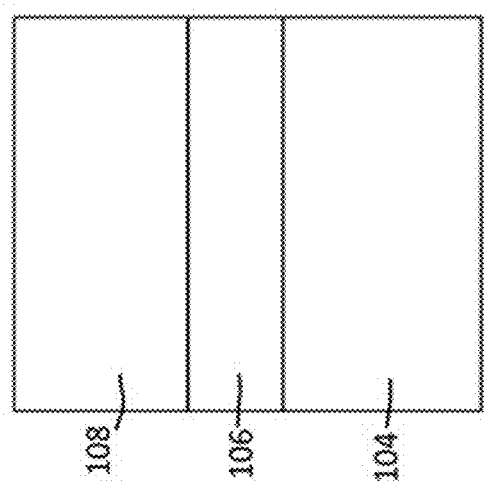
FIG. 9(a), FIG. 9(b) and FIG. 9(c) illustrate VCSEL embodiments comprising one or more active regions.
Figure 9B:
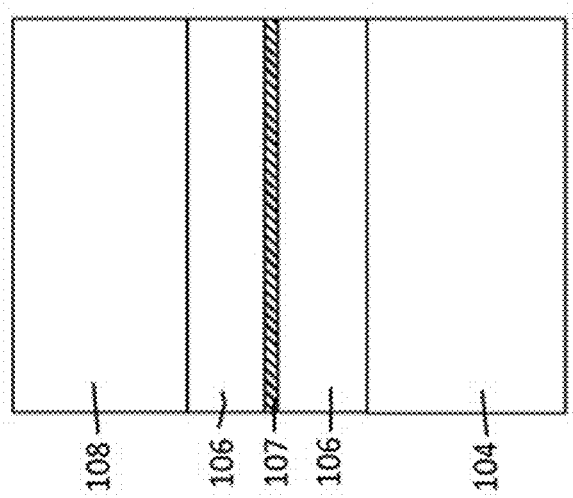
Figure 9C:
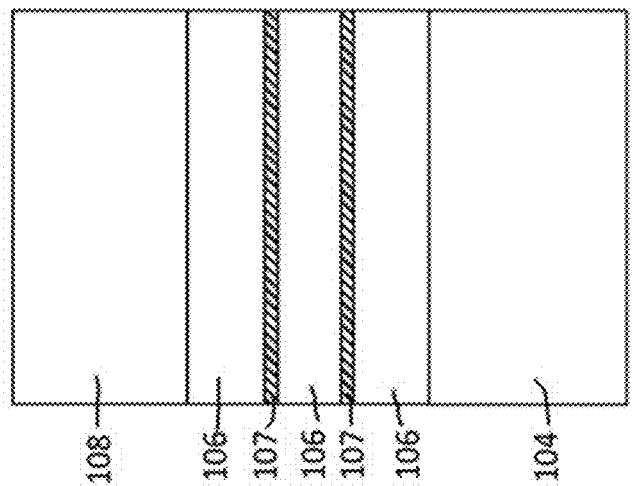

In various Figures discussed herein, like in FIG. 9(a), although active regions 106 may be shown as a single layer, it is understood that active region 106 may consist of a single MQW or multiple MQW regions, as shown in FIG. 9(b) and FIG. 9(c). FIG. 9(a) shows a VCSEL having only one active region 106, while FIG. 9(b) shows two active regions 106 separated, but joined electrically by a reverse tunnel junction 107, and FIG. 9(c) shows three active regions 106 each separated and joined by a reverse tunnel junction 107. It is understood that any of a multitude of active regions 106 separated and joined with at least one tunnel junction may be used in an embodiment. In order to implement multiple active regions, several design layers may be adjusted in order to accommodate the additional MQW regions. For example, referring to FIGS. 1 and 2, the mesa depth for mesas 103 and 105 could be extended, and referring to FIG. 1, the dielectric coating 114 and referring to FIG. 1 and FIG. 2, the metal heat sink layer 124 may be adjusted to account for the added height of the mesas and to provide adequate mesa coverage.

Figure 10:
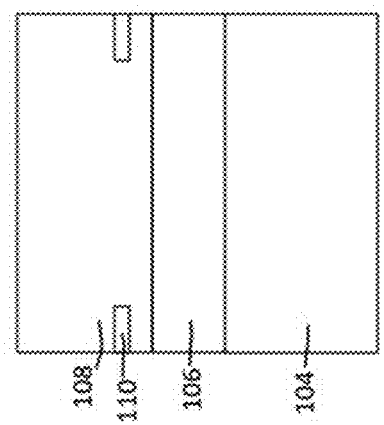
FIG. 10(a), FIG. 10(b), FIG. 10(c) and FIG. 10(d) illustrate VCSEL embodiments comprising one or more active regions including a confinement layer and/or a tunnel junction.
Figure 10B:
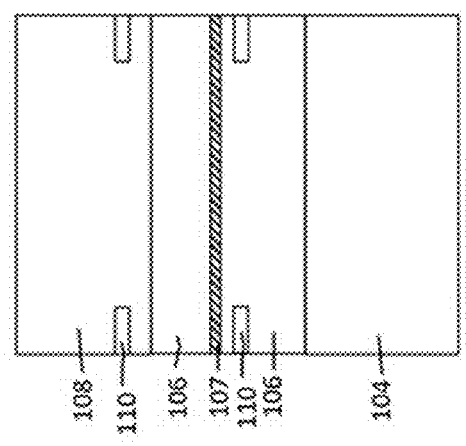
Figure 10C:
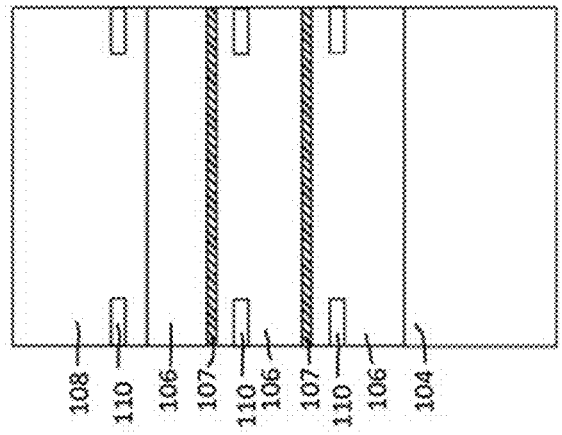
Figure 10:
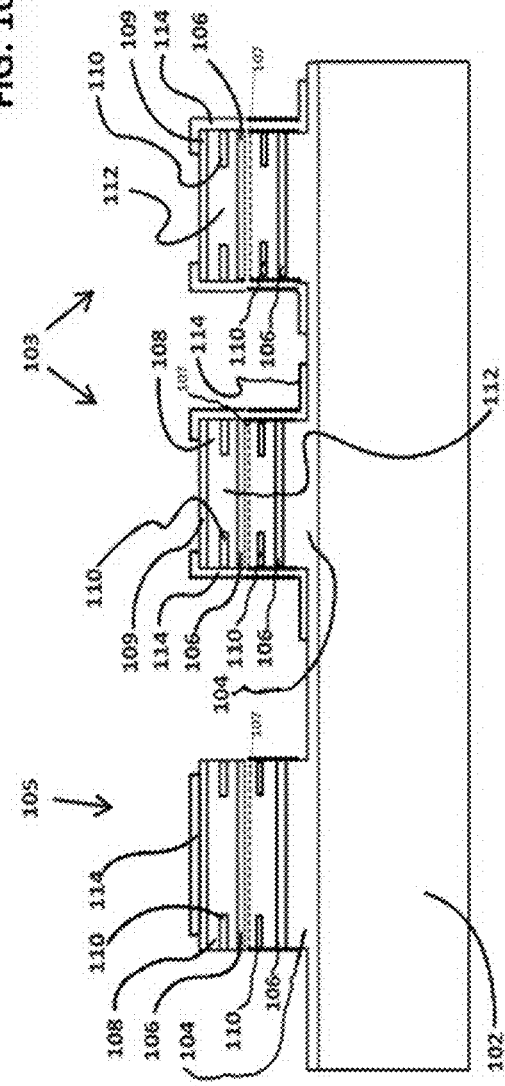

In some instances, as shown in FIGS. 10(a)-10(d), additional oxidation confinement layers 110 situated above each individual active region 106 may be in included. FIG. 10(a), FIG. 10(b), and FIG. 10(c) depict one, two and three MQW regions, respectively, separated and joined electrically by tunnel junctions 107, with each MQW having a current confinement layer 110. FIG. 10(d) illustrates an alternative view of tunnel junction 107 joining a plurality of MQW regions, along with the placement for an oxide confinement layer 110 within an active region 106 and upper layer 108.

Additionally, as depicted in FIGS. 11(a)-11(c), for confinement of carriers to the aperture area and improved reliability, an implant 111 may be used in conjunction with the oxide layer 110. The implant 111 may be placed around the active region(s) 106 and a top most active region 108. The oxide confinement layer 110 may be placed in the implant 111 next to the top most active region 108. FIG. 11(a), FIG. 11(b), and FIG. 11(c) depict embodiments comprising one, two and three MQW regions, respectively. The active regions 106 in FIG. 11(b) and FIG. 11(c) may be joined electrically by tunnel junctions 107 that extend in and through the implant 111, such that each active region comprises at least one implantation 111 for confinement of carriers.

FIGS. 12(a)-(c) illustrate how implants 111 can be used in conjunction with an oxide layer in each active region. FIG. 12(a), FIG. 12(b), and FIG. 12(c) depict one, two and three MQW regions, respectively, with the multiple active regions 106 joined electrically by tunnel junctions 107. Each MQW region has both a current confinement layer 110 in active region 106 along with implantation 111.

While the present disclosure has been illustrated and described herein in terms of several alternatives, it is to be understood that the techniques described herein can have a multitude of additional uses and applications. Accordingly, the disclosure should not be limited to just the particular description, embodiments and various drawing figures contained in this specification that merely illustrate one or more embodiments, alternatives and application of the principles of the disclosure.

What is claimed:
1. A VCSEL array device, comprising:
a semiconductor substrate;
two or more VCSEL devices, each VCSEL device comprising:
a first mesa on top of the semiconductor substrate, each first mesa forming a first side and including a lower mirror in contact with the semiconductor substrate, an upper mirror,
a plurality of epitaxially stacked active regions electrically joined with reverse tunnel junctions, each active region generating a light and positioned between the lower mirror and the upper mirror, and
a first metal contact pad in electrical contact with the upper mirror;
one or more short-circuited devices, each-short circuited device among the one or more short-circuited devices forming a second mesa on top of the semiconductor substrate, each second mesa forming a second side and including a second metal contact pad electrically connected to the semiconductor substrate;
a plurality of metal heat sink structures deposited over each VCSEL device and each short circuited device, a first set of heat sink structures among the plurality of metal heat sink structures deposited over each VCSEL device, the first set of heat sink structures electrically connected to the first metal contact pad and electrically isolated from the semiconductor substrate, a second set of heat sink structures among the plurality of metal heat sink structures deposited over each short-circuited device and electrically connected to the second metal contact pad and electrically isolated from the first set of heat sink structures; and a heat-spreading substrate bonded to the first set of heat sink structures and the second set of heat sink structures.

2. The VCSEL array device as recited in claim 1, wherein a layer of a dielectric material is positioned between at least the first side and a portion of an upper surface of the upper mirror and the first set of heat sink structures.

3. The VCSEL array device as recited in claim 1, further comprising a bonding layer between the heat-spreading substrate and the first set of heat sink structures and the second set of heat sink structures.

4. The VCSEL array device as recited in claim 3, wherein the first set of heat sink structures and the second set of heat sink structures are flip-chip bonded to the heat-spreading substrate.

5. The VCSEL array device as recited in claim 4, wherein the two or more VCSEL devices are connected in parallel, further comprising a ground plane surrounding substantially all of the two or more VCSEL devices forming a coplanar waveguide lead and electrically connected to the second metal contact pad of each short circuited device to form a ground-signal-ground configuration.

6. The VCSEL array device as recited in claim 5, wherein the second metal contact pad of each short circuited device is electrically connected to the ground plane without wire bonding.

7. The VCSEL array device as recited in claim 4, wherein the two or more VCSEL devices are connected in parallel, further comprising a ground plane completely surrounding the two or more VCSEL devices forming a coplanar waveguide lead and electrically connected to the second metal contact pad of each short circuited device to form a ground-signal-ground configuration.

8. The VCSEL array device as recited in claim 1, wherein the two or more VCSEL devices further include a containment region positioned between the active region and the first metal contact pad, the containment region defining an aperture reducing capacitance within the first mesa.

9. The VCSEL array device as recited in claim 1, further comprising a set of lenses positioned over the two or more VCSEL devices.

10. The VCSEL array device as recited in claim 9, wherein each lens in the set of lenses is positioned over each VCSEL device by an offset distance necessary to direct the light to a location.

11. The VCSEL array device as recited in claim 1, wherein the VCSEL array device is used as an emitter for high speed data communication in at least one of an optical fiber and an optical free space.

12. The VCSEL array device as recited in claim 1, wherein the VCSEL array device is used as a short pulse emitter for material processing or an optical pump.

13. The VCSEL array device as recited in claim 1, wherein the VCSEL array device is used as a pulsed emitter for laser detection and ranging or light detection and ranging.

14. The VCSEL array device as recited in claim 1, wherein the VCSEL array device is used in at least one of a beam steering device and an illuminating device.

15. The VCSEL array device as cited in claim 1, wherein each epitaxially stacked active region among the plurality of epitaxially stacked active regions comprises a multi-quantum well (MQW) made of a same or a different bandgap MQW.

16. The VCSEL array device as cited in claim 15, wherein each epitaxially stacked active region includes an oxide confinement layer.

17. The VCSEL array device as cited in claim 1, wherein each epitaxially stacked active region among the plurality of epitaxially stacked active regions is surrounded by an implant confinement layer.

18. The VCSEL array device as cited in claim 17, wherein the reverse tunnel junction extends through the implant confinement layer, and wherein a top-most active region contains an oxide confinement layer.

19. The VCSEL array device as cited in claim 1, wherein each epitaxially stacked active region among the plurality of epitaxially stacked active regions has a different gain offset.

20. The VCSEL device, comprising:
a semiconductor substrate;
at least one series-connected VCSEL array, each VCSEL array comprising a semiconductor die including a semiconductor substrate and a conductive cathode layer, a sub-mount including a metallization pattern to serially connect a plurality of electrically conductive regions, each comprising:
two or more VCSEL element, each VCSEL element comprising:
a first mesa on top of the semiconductor substrate, each first mesa forming a first side and including a lower mirror in contact with the semiconductor substrate,
an upper mirror,
a plurality of epitaxially stacked active regions electrically joined with reverse tunnel junctions, each active region generating a light and positioned between the lower mirror and the upper mirror, and
a first metal contact pad in electrical contact with the upper mirror;
one or more short-circuited devices, each-short circuited device among the one or more short-circuited devices forming a second mesa on top of the semiconductor substrate, each second mesa forming a second side and including a second metal contact pad electrically connected to semiconductor substrate;
a plurality of metal heat sink structures deposited over each VCSEL element and each short circuited device, a first set of heat sink structures among the plurality of metal heat sink structures deposited over each VCSEL element, the first set of heat sink structures electrically connected to the first metal contact pad and electrically isolated from the semiconductor substrate, a second set of heat sink structures among the plurality of metal heat sink structures deposited over each short-circuited device and electrically connected to the second metal contact pad and electrically isolated from the first set of heat sink structures; and
a heat-spreading substrate bonded to the first set of heat sink structures and the second set of heat sink structures.

* * * * *